United States Patent
Kuehlmann et al.

(10) Patent No.: US 8,020,125 B1
(45) Date of Patent: Sep. 13, 2011

(54) SYSTEM, METHODS AND APPARATUS FOR GENERATION OF SIMULATION STIMULUS

(75) Inventors: Andreas Kuehlmann, Berkeley, CA (US); Nathan Kitchen, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 297 days.

(21) Appl. No.: 12/208,234

(22) Filed: Sep. 10, 2008

(51) Int. Cl.
*G06F 17/50* (2006.01)

(52) U.S. Cl. ............... 716/106; 703/14; 706/19

(58) Field of Classification Search .......... 716/106; 703/14; 706/19
See application file for complete search history.

(56) References Cited

U.S. PATENT DOCUMENTS

| | | | | |
|---|---|---|---|---|
| 5,855,011 | A * | 12/1998 | Tatsuoka | 706/45 |
| 6,031,984 | A * | 2/2000 | Walser | 703/2 |
| 6,058,206 | A * | 5/2000 | Kortge | 382/159 |
| 6,058,385 | A * | 5/2000 | Koza et al. | 706/13 |
| 6,424,959 | B1 * | 7/2002 | Bennett et al. | 706/13 |
| 6,556,978 | B1 * | 4/2003 | Ginsberg et al. | 706/19 |
| 6,832,069 | B2 * | 12/2004 | Stout et al. | 434/353 |
| 7,003,510 | B2 * | 2/2006 | Andreev et al. | 1/1 |
| 7,036,720 | B2 * | 5/2006 | Mezard et al. | 235/375 |
| 7,260,800 | B1 * | 8/2007 | Koelbl et al. | 716/5 |
| 7,353,216 | B2 * | 4/2008 | Iyer et al. | 706/46 |
| 7,409,325 | B2 * | 8/2008 | Morara | 703/2 |
| 7,512,912 | B1 * | 3/2009 | Iyer | 716/4 |
| 2005/0257178 | A1 * | 11/2005 | Daems et al. | 716/2 |
| 2008/0103750 | A1 * | 5/2008 | Khasidashvili et al. | 703/16 |
| 2008/0208560 | A1 * | 8/2008 | Johnson et al. | 703/22 |

OTHER PUBLICATIONS

Bryant, "Graph-Based Algorithms for Boolean Function Manipulation", IEEE Transactions on Computers, vol. 35, Issue 8, pp. 677-691, Aug. 1986.
Een et al, "An Extensible SAT-Solver", available at http://citeseer.ist.psu.edu/een03extensible.html.
Geman et al, "Stochastic Relaxation, Gibbs Distributions, and the Bayesian Restoration of Images", IEEE Transactions on Pattern Analysis and Machine Intelligence, vol. PAMI-6, No. 6, pp. 721-741, Nov. 1984.
Gelfand et al, "Sampling-Based Approaches to Calculating Marginal Densities", Journal of the American Statistical Associates, vol. 85, No. 410, pp. 398-409, Jun. 1990.
Gogate et al, "A New Algorithm for Sampling CSP Solutions Uniformly at Random", Principles and Practive of Contraint Programming—CP 2006, vol. 4204/2006.
Hastings, "Monte Carlo sampling methods using Markov chains and their applications", Biometrics, vol. 57, No. 1, pp. 97-109, 1970.
Ho et al, "Smart Simulation Using Collaborative Formal and Simulation Engines", International Conference on Computer-Aided Design, IEEE, pp. 120-126, 2000.

(Continued)

*Primary Examiner* — Naum Levin
(74) *Attorney, Agent, or Firm* — Holland & Knight LLP; Brian J. Colandreo, Esq.; Mark H. Whittenberger, Esq.

(57) ABSTRACT

A method and apparatus for producing a verification of digital circuits is provided. In an exemplary embodiment, a set of Boolean and Integer constraints are derived, and a set of Boolean and Integer stimuli are generated that meet the constraints. These stimuli are then used to verify a digital design, and a verification report is generated. In other example embodiments, a computing apparatus and computer software product are provided. The computer software product containing a set of executable instructions that, when executed, configure the computing apparatus to produce a verification report by the provided methods.

24 Claims, 14 Drawing Sheets

OTHER PUBLICATIONS

Iyer et al, "Race: A Word-Level ATPG-Based Constraints Solver System for Smart Random Simulation", IEEE, ITC International Test Conference, Papter 11.4, pp. 299-308, 2003.

Metropolis et al, "Equation of State Calculations by Fast Computing Machines", The Journal of Chemical Physiscs, vol. 21, No. 6, pp. 1087-1092, Jun. 1953.

Selman et al, "Local Search Strategies for Satifiability Testing", DIMACS Series in Discrete Mathematics and Theoretical Computer Science, pp. 1-12, Jan. 1995.

Shimizu et al, "Deriving a Simulation Input Generator and a Coverage Metric From a Formal Specification", DAC, pp. 801-806, Jun. 2002.

Wei et al, "Towards Efficient Sampling: Exploiting Random Walk Strategies", Proceedings of the National Conference on Artificial Intelligence, No. 19, pp. 670-676, 2004.

Xiu et al, "Early Research Experience With OpenAccess Gear: An Open Source Development Environment for Physical Design", ISPD, pp. 94-100, Apr. 2005.

Yuan et al, "Modeling Design Constraints and Biasing in Simulation Using BDDs", Proceedings of the 1999 IEEE/ACM international conference on Computer-aided design pp. 584-590, 1999.

Yuan et al, "Simplifying Boolean Constraint Solving for Random Simulation-Vector Generation", IEEE Transactions on Computer-Aided Design of Integrated Circuits and Systems, vol. 23, No. 3, pp. 412-420, Mar. 2004.

* cited by examiner

Figure 1: Structure of a setup for constrained random verification.

Example for distribution function computed by (2) and (3): (a) $[y_k \leq c_1] \wedge [y_k \geq c_2]$ with $c_1 > c_2$, (b) $[y_k \leq c_1] \wedge [y_k \geq c_2]$ with $c_1 < c_2$, and (c) $[y_k \leq c_1] \vee [y_k \geq c_2]$.

| Mixed Boolean/integer sampler |
|---|
| 1: {Given: clauses $\{C_j\}$; number of samples $N$; length of mixing queue $M$; parameter $t$; decimation period $K$} |
| 2:   $(x,y) :=$ random assignment |
| 3: for $j := 1$ to $M$ do {warm up queue} |
| 4:     for $k := 1$ to $t$ do |
| 5:         $(x,y) :=$ SAMPLE$(x,y)$ |
| 6:     $QUEUE[j] := (x,y)$ |
| 7: for $j := 1$ to $N$ do {generate samples} |
| 8:     for $k := 1$ to $K$ do {decimate sample stream} |
| 9:         $(x,y) :=$ SAMPLE$(x,y)$ |
| 10:     select $r \in \{1,\ldots,M\}$ uniformly at random |
| 11:     $(x',y') := QUEUE[r]$ |
| 12:     $QUEUE[r] := (x,y)$ |
| 13:   output $(x',y')$ |

FIG. 9

: SAMPLE

1: {Given: clauses $\{C_i\}$; current assignment $(x,y)$; parameters $R, p$}
2: $(x,y) :=$ METROPOLISMOVE$(x,y)$
3: for $i := 1$ to $R$ do {recovery moves}
4:     if $(x,y)$ satisfies all clauses $C_i$ then
5:         return $(x,y)$
6:     with probability $p$ do
7:         $(x,y) :=$ METROPOLISMOVE$(x,y)$
8:     else
9:         $(x,y) :=$ WALKSATMOVE$(x,y)$
10: $(x,y) :=$ DPLLMOVE$(x,y)$
11: return $(x,y)$

FIG. 10

| METROPOLISMOVE |
|---|
| 1: {Given: clauses $\{C_i\}$; assignment $(x,y) = (x_1,\ldots,x_m; y_1,\ldots,y_n)$; temperature $T$} |
| 2: $U :=$ # clauses unsatisfied under $(x,y)$ |
| 3: select $j \in \{1,\ldots,m+n\}$ uniformly at random |
| 4: if $1 \leq j \leq m$ then {Update Boolean variable} |
| 5:     $x' := x$; $x'_j := \bar{x}_j$ {Flip $x_j$} |
| 6:     $y' := y$ |
| 7: else            {Update integer variable} |
| 8:     $x' := x$ |
| 9:     $k := j - m$ |
| 10:     $y' := y$; $y'_k := \text{GIBBS}(x,y,y_k)$ |
| 11: $U' :=$ # clauses unsatisfied under $(x',y')$ |
| 12: $\Delta U := U' - U$ |
| 13: $Q :=$ probability of proposing move $(x,y) \to (x',y')$ |
| 14: $Q' :=$ probability of proposing move $(x',y') \to (x,y)$ |
| 15: $p := e^{-\Delta U/T} Q' Q^{-1}$ |
| 16: with probability $\min\{p, 1\}$ do |
| 17:     return $(x',y')$ |
| 18: else |
| 19:     return $(x,y)$ |

FIG. 11

PRIOR ART

| GIBBS |
|---|
| 1: {Given: clauses $\{C_i\}$; assignment $(x,y) = (x_1,\ldots,x_m;$ $y_1,\ldots,y_n)$; variable $y_k$ to be resampled} |
| 2: $\{C'_j\} :=$ PROJECT($\{C_i\}, x, y \backslash y_k$) {$C'_j$ constraints on $y'_k$ only} |
| 3: $y'_k :=$ SAMPLEFROM($\{C'_j\}$) |
| 4: return $y'_k$ |

FIG. 12

| WALKSATMOVE |
|---|
| 1: {Given: clauses $\{C_i\}$; assignment $(x,y) = (x_1,\ldots,x_m;$ $y_1,\ldots,y_n)$; noise parameter $q$} |
| 2: select unsatisfied clause $C_j$ uniformly at random |
| 3: with probability $q$ do    {Random move} |
| 4:     select literal $l \in C_j$ uniformly at random |
| 5:     return FLIPLIT$(l,x,y)$ |
| 6: else                          {Greedy move} |
| 7:     for each literal $l_k \in C_j$ do |
| 8:         $(x^k, y^k) :=$ FLIPLIT$(l_k, x, y)$ |
| 9:         $U_k :=$ # clauses unsatisfied under $(x^k, y^k)$ |
| 10:    $k^* := \arg\min_k \{U_k\}$ |
| 11:    return $(x^{k^*}, y^{k^*})$ |

FIG. 13

FLIPLIT

1: {Given: clauses $\{C_i\}$; generalized literal $l$; $(x,y) = (x_1,\ldots,x_m; y_1,\ldots,y_n)$}
2: if $l$ is Boolean then
3:     $j := \text{VARINDEX}(l)$
4:     $x' := x;\ x'_j := \bar{x}_j$ {Flip $x_j$}
5:     return $(x', y)$
6: else {Integer constraint}
7:     $S := \text{SUPPORT}(l)$ {Indices of variables in constraint}
8:     select $k \in S$ uniformly at random
9:     $y' := y;\ y'_k := \text{GIBBS}(x, y, y_k)$
10:     return $(x, y')$

FIG. 14

SYSTEM, METHODS AND APPARATUS FOR GENERATION OF SIMULATION STIMULUS

FIELD OF THE INVENTION

The present invention generally relates to integrated circuits. More particularly, the invention concerns methods and apparatus for generation of stimulus for verification of integrated circuit designs.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs must be highly functional, low cost and have low power consumption. These demands create increased complexity on the design, verification, and manufacture of ICs.

A typical IC design may involve the creation of electronic components, such as transistors and resistors, and the interconnections of these components onto a substrate, such as silicon. Functional verification of a digital design involves the verification that the design conforms to the specification. Functional verification may involve the validation that a design meets the desired functionality. Part of the process of verification includes the creation of Register Transfer Level (RTL) digital designs that describe in detail the functionality of the device or block at every cycle of the clock. Creation and verification RTL design may be one of the more difficult portions of the design process. In many instances, this verification is a very difficult and time intensive task. Simulation tools are typically used to assist in verification. In most designs, simulation-based functional verification is performed on multiple machines in parallel. During the verification process, "coverage" data is produced that indicates which portions of the functionality and/or code have been tested.

Many contemporary verification flows in industry have adopted a combination of formal property checking and constrained random testing. At their core, both approaches require efficient constraint solving, but formal verification typically seeks out a single solution. In constrained random testing the generation of the stimulus set requires repeated generation of solutions with a good distribution (e.g., uniform) over the solution space. A number of approaches to constrained problem solutions and to stimulus generation for constrained random testing have been used in the art. The efficiencies of these approaches typically fail in either their ability to provide good uniform distribution of stimulus over the solution set, or in their run-time and memory efficiency. Further, some approached perform well for small problems but their performance degrades substantially with the size of the problem.

Therefore there exists a need for a system, and methods for improved stimulus generation for verification of digital design descriptions. One that can produce an appropriate distribution of stimulus in an efficient manner and that scales well to large problems.

SUMMARY OF THE INVENTION

In an embodiment, a system and method of producing a verification of a digital design is provided. The method involves generating a design description from a digital design. A set of Boolean constraints and a set of integer constraints is then generated from the digital design description. One feature of these sets is that they constrain a set of stimuli to be valid for design description. The method continues by generating a mixed Boolean-Integer input stimuli set that satisfies both the Boolean and Integer constraints. A verification is then performed on the design description using this set of stimuli and a verification report is produced.

Various embodiments of the present invention allow for fast generation of integrated circuit design verification, mixed with Boolean/integer input stimuli, that have a well-defined (uniform) distribution. In one embodiment, the stimulus generator is runtime- and memory-efficient for a large set of practical constraints. Various embodiments of the stimulus generator can be implemented in hardware, thus supporting the use of hardware emulation/acceleration to accelerate the testbench for specific constraint sets. Various embodiments of the present invention were published and a reduction to practice discussed in Kitchen, N.; Kuehlmann, A., "Stimulus generation for constrained random simulation," Proceedings of the 2007 IEEE/ACM International Conference on Computer Aided Design pp 258-265, November 2007 which is hereby incorporated by reference in its entirety. This paper was presented at ICCAD 2007, San Jose Calif. 4-8 Nov. 2007.

These and other features and advantages of embodiments of the present invention will be appreciated from review of the following detailed description of the invention, along with accompanying figures in which like reference numerals refer to like parts throughout.

BRIEF DESCRIPTION OF THE DRAWINGS

Various embodiments of the present invention taught herein are illustrated by way of example, and not by way of limitation, in the figures of the accompanying drawings, in which:

FIG. 9 is a pseudo-code representation of one provided method;

FIG. 10 is a pseudo-code representation of a provided sampling method;

FIG. 11 is a pseudo-code representation of the MetropolisMove algorithm;

FIG. 12 is a pseudo-code representation of the Gibbs algorithm;

FIG. 13 is a pseudo-code representation of the WalkStatMove algorithm; and

FIG. 14 is another pseudo-code representation of a dependency used by other methods.

Figure 1:
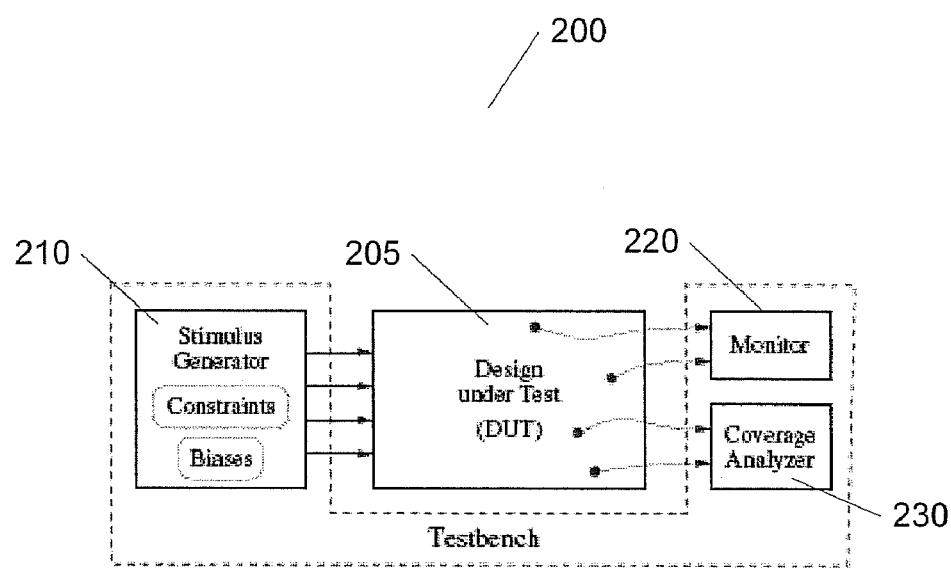
FIG. 1 illustrates the structure of a setup for constrained random verification that may be used with embodiments of the present invention.

It will be recognized that some or all of the figures are schematic representations for purposes of illustration and do not necessarily depict the actual relative sizes or locations of the elements shown. The figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well known components, methods and/or processing techniques are omitted so as to not unnecessarily obscure the invention. As used herein, the "present invention" refers to any of the embodiments of the invention described herein, and any equivalents. Furthermore, reference to various feature(s) of the "present invention" throughout this document does not mean that all claimed embodiments or methods must include the referenced feature(s).

Verification is the process of validating whether a circuit design conforms to the specification it was designed to meet. In smaller designs the task of verification may be trivial, but as digital design complexity increases verification becomes significantly difficult. In most digital designs suited for commercial applications, there may be no possibility of exercising all logic. Simulation-based verification is widely used to simulate the design. Stimulus is provided in the form of a test bench that seeks to verify the design by providing scenarios that attempt to ascertain that a design responds to a given input by producing an appropriate output.

Constrained random simulation is the main workhorse in today's hardware verification flows. It requires the random generation of input stimuli that obey a set of declaratively specified input constraints, which are then applied to validate given design properties by simulation. The efficiency of the overall flow depends critically on (1) the performance of the constraint solver and (2) the distribution of the generated solutions. Various embodiments of the present invention provide for efficient constraint solving for stimulus generation for mixed Boolean/integer variable domains and a new hybrid solver based on Markov-chain Monte Carlo methods with good performance and distribution.

As illustrated in FIG. 1, a typical test bench 200 for constrained random verification (CRV) of a design under test (DUT) 205 includes a generator of random stimuli 210, monitors 220 that check the correctness of the behavior, and coverage analyzers 230 for measuring which parts of the state space have been verified. In order to avoid generating invalid stimuli that might lead to false negative verification results, the stimulus generator must obey input constraints. For example, the implementation of a protocol interface may only be correct for data packets with valid headers, so the input constraints would exclude invalid headers. The constraints may be implicit in the generator code, or they may be given explicitly as input to the generator. Specific programming languages that may be used in practice for specifying testbenches include SystemC, SystemVerilog; and e.

Efficiency of the constraint solver is as important as the quality of the stimulus distribution. An inefficient solver impacts the overall verification effort by long runtimes for stimulus generation, whereas a highly skewed distribution can dramatically increase the number of simulation steps required to execute a target transition of the design. This dual challenge is particularly demanding as the search for a single solution is already NP-hard for non-trivial Boolean constraints. The difficulty of the problem is reflected in the limitations of state-of-the-art tools for CRV. Some tools generate random values efficiently, but from highly non-uniform value distributions, resulting in increased time to achieve coverage. Moreover, the distributions are unstable—they vary significantly with small changes in the specification, such as changes in variable declaration order. Other approaches generate values uniformly but rely on methods (e.g., binary decision diagrams) that do not scale well to large designs.

Fast generation of input stimuli that have a well-defined distribution is therefore critical for an efficient integrated circuit design verification flow based on constrained random simulation. Novel embodiments of the present invention provide an apparatus and methods for stimulus generation that are runtime and memory efficient for large sets of practical constraints. They also provide a well-defined (uniform) distribution of solutions. Specifically, some existing state-of-the-art stimulus generation tools generate random values efficiently, but from highly non-uniform value distributions, resulting in increased time to achieve coverage. Moreover, in some of the prior art, the distributions are unstable in that they vary significantly with small changes in the specification, such as changes in variable declaration order. Other tools generate values uniformly but rely on methods (binary decision diagrams) that do not scale successfully to large designs.

Figure 2:
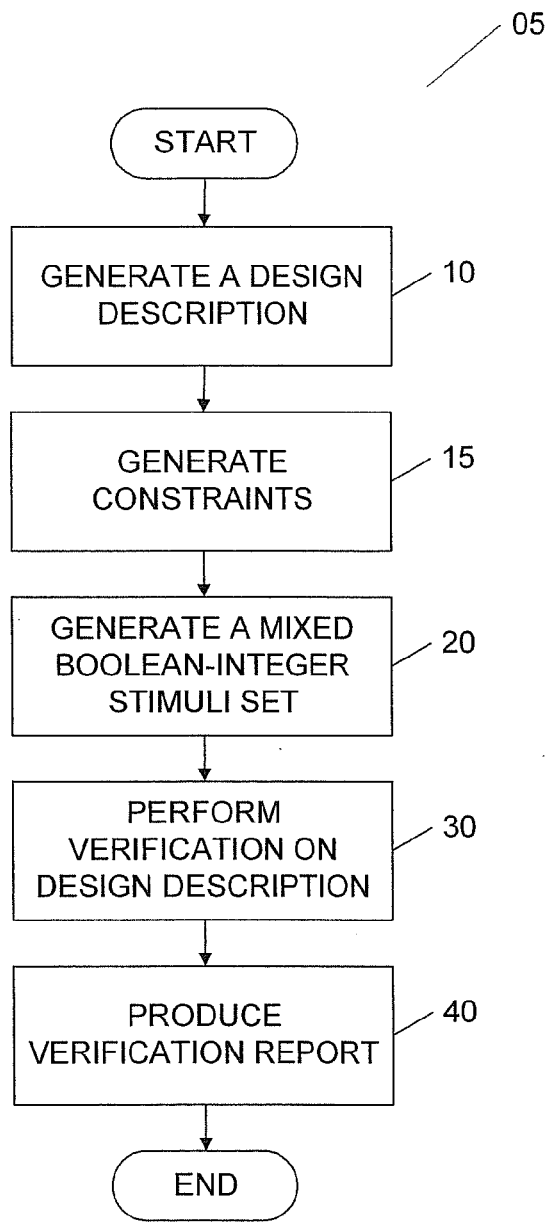
FIG. 2 is a flow chart illustration of a provided method.

FIG. 2 illustrates an example embodiment of a provided method for the production of a verification report for a digital design. In this embodiment, the method begins with stage 10 where a design description is generated from a digital design. In stage 15, a set of Boolean and Integer constraints are generated for the design description. These constraints are generated to ensure that any set of stimuli meeting the constraints is a valid set of stimuli for the design description. In stage 20, a mixed Boolean-Integer stimuli set is generated. These stimuli obeying the constraints generated in stage 15. At stage 30, a verification is performed on the digital design description using the stimuli. In stage 40, a verification report is produced.

In one embodiment, embodiment, the constraint generation uses a combination of Boolean variables and integer variables of bounded domain (i.e., of fixed bit-width) for the inputs of the DUT. A combination of Boolean constraints and restricted classes of inequalities on the integers are supported. For example, let $x=(x_1, \ldots, x_m)$ denote a vector of m Boolean variables and $y=(y_1, \ldots, y_n)$; $-2^{B-1} \leq y_i \leq 2^{B-1}-1$ denote a vector of n integer variables, where B is a positive integer, i.e., the maximum bit-width of $y_i$. The constraints on assignments to x are specified in terms of a Boolean function $f(x)$, where $f(x)=1$ for all valid assignments x. One embodiment allows the constraints on y to be conditional on x, i.e., different assignments for x may "trigger" different constraints on the y values. The constraint which is active for a particular set of values of x is denoted by $g(x)(y)$. Then the set of valid $(x,y)$ is defined by:

$$\{(x,y); f(x)=1 \wedge g^{(x)}(y)=1\}$$

In the most general form, each $g^{(x)}(y)$ is expressed as a disjunction of conjunctions of predicates $g_{ij}^{(x)}$ of the y variables:

$$g^{(x)}(y) = \bigvee_i \bigwedge_j g_{ij}^{(x)}(y)$$

where each $g_{ij}^{(x)}(y)$ denotes the indicator function for a constraint on the values of y. The $\wedge_{ij}^{(x)}(y)$ can be seen as bounding a single region in the y space, and their disjunction $\vee_i$ combines multiple regions that are valid for particular x values.

In general, the $g_{ij}^{(x)}(y)$ can be general arbitrary arithmetic constraints on the y variables. In an example embodiment, these constraints are restricted to the type of constraints that can be efficiently solved and are of practical value. In this embodiment, the y variables are constrained by inequalities i.e. $(a=b) \Leftrightarrow (a \leq b) \Leftrightarrow (a \geq b)$. One feature of this embodiment is that it allows for very efficient inner loop sampling as long as every inequality can be resolved explicitly for each $y_k$. An exemplary sampling technique is commonly referred to as Gibbs sampling. For the purpose of completeness, pseudo-code of the Gibbs algorithm is provided in FIG. 12

In another embodiment, the set of integer constraints $g \sim t)$ (y) are linear inequality constraints. In this embodiment, the valid assignments to y are the solutions of a system of inequalities whose coefficients depend on x:

$$\sum_{v=1}^{n} a_{uv}^{(x)} y_v \leq b_u^{(x)}; a_{uv}^{(x)}, b_u^{(x)} \in Z$$

yielding $$g_{ij}^x(y) = \left[\sum_{v=1}^{n} a_{uv}^{(x)} y - b_u \leq 0\right]$$

where [P] denotes the indicator function of event P.

A further embodiment employs a class of non-linear constraints which include multi-linear inequalities. These constraints are characterized as a class of constraints where terms may multiply several variables but are linear in the individual variables. For example, a system of multi-linear constraints may be expressed as:

$$\sum_{v} a_{uv}^{(x)} \pi_v \leq b_u^{(x)}; a_{uv}^{(x)}, b_u^{(x)} \in Z$$

where each $\pi_v$ is the product of some subset of $\{y_1, \ldots, y_n\}$. The corresponding constraint functions are then described as:

$$g_{ij}^x(y) = \left[\sum_{v=1}^{n} a_{uv}^{(x)} \pi_v - b_u^{(x)} \leq 0\right]$$

One respect of this embodiment is that multi-linear constraints can express multiplicative constraints that cannot be encoded as linear inequalities. This allows for significant flexibility in the set of constraints that may be employed. Another feature of embodiments of the present invention is that they provide input stimuli that are samples from non-connected solution spaces of the design description. This leads to a more robust stimuli set and therefore reduces the possibilities of incomplete coverage in the design.

One embodiment of stage 20, where a set of stimuli are generated, includes generating a set of valid stimuli for the digital design description that are constrained by the sets of Integer and Boolean constraints described above. An example embodiment of this generation of stimuli employs the Metropolis-Hastings, Gibbs sampling, or Walk SAT algorithms. For the purpose of completeness, pseudo-code is provided for the exemplary embodiments of discussed algorithms in FIGS. 9-14.

Figure 3:
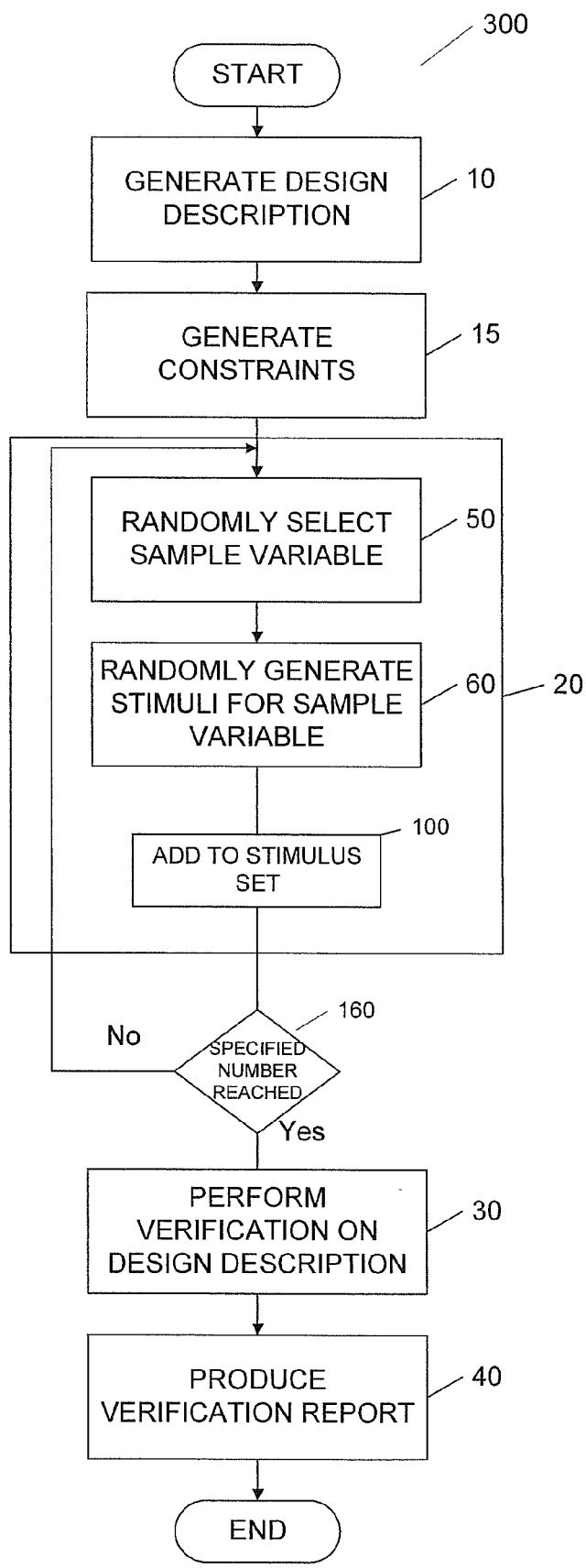
FIG. 3 is a flow chart illustration of a provided method.

A flowchart for another embodiment of a provided method 300 is illustrated in FIG. 3. In this embodiment, begins with stage 10, where a digital design description is generated. As is known in the art design descriptions may take the form of software written in a description language such as Verilog or VHDL. In stage 15 a mixed set of Integer and Boolean constraints are generated for the design description. In this embodiment, stage 20 comprises additional stages of 50, 60, 100, and 160. Stage 50 provides a random selection of a sample variable that is made from the design description. In stage 60 a stimuli is randomly generated for the selected sample variable. In stage 100 the value is added to the stimuli set for the selected variable. The method 300 may proceed to conditional stage 160 to determine whether a preset number of stimuli has been generated. If the specified number of stimuli has not been generated, the method 300 continues back to stage 50, and the process iterates until conditional stage 160 is met. If it is determined in conditional stage 160 that the predetermined number of stimuli has been generated, the method 300 continues to stage 30 where the stimuli are used to perform verification on the design description. The method 300 then continues to stage 40 where a verification report is produced.

Figure 4:
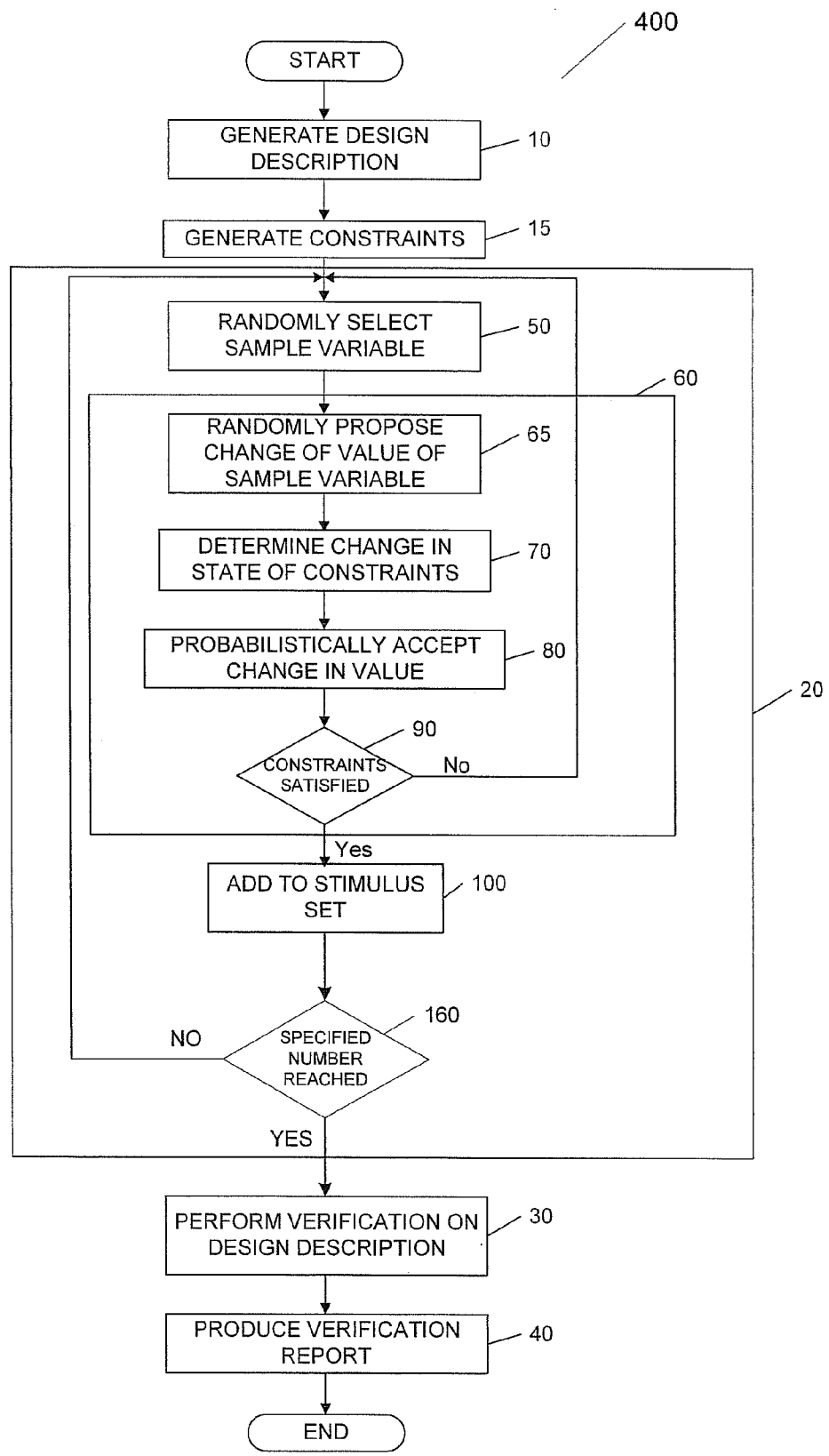
FIG. 4 is a flow chart illustration of a provided method.

Another embodiment of a provided method 400 is illustrated in FIG. 4. In this embodiment, the method 400 begins with stage 10 where a digital design description is generated for a design. In stage 15 a set of mixed Boolean-Integer constraints are generated for the digital design. In stage 50 a random selection of a sample variable is made from the set of variables in the description. Stage 65 provides a random assignment or change of value is proposed for the selected sample variable. At stage 70, the change in a state of constraints is determined. At stage 80, where based on a probability, the proposed change is accepted. In stage 90 it is determined if the constraints are satisfied. If the constraints are not satisfied, the change is discarded, and the method returns to stage 50 for the next iteration. If the accepted change satisfies the constraints, the method continues to stage 100 where it is added to the stimuli set. At stage 160 it is determined if a pre-specified number of stimuli has been generated. If the pre-specified number has not been reached, the method continues back to stage 50 and iterates until conditional stage 160 is met. At stage 30 the stimuli set is used to perform verification on the design description, then to stage 40 where a verification report is produced.

In an example embodiment of a probabilistic acceptance, described in stage 80 above, a threshold is determined for a number of clauses that must be satisfied before any proposed stimulus is accepted. As used herein clause refers to a conjunctive expression of variables. If it satisfies at least the threshold number of clauses, it is accepted; otherwise it is not accepted.

Figure 5:
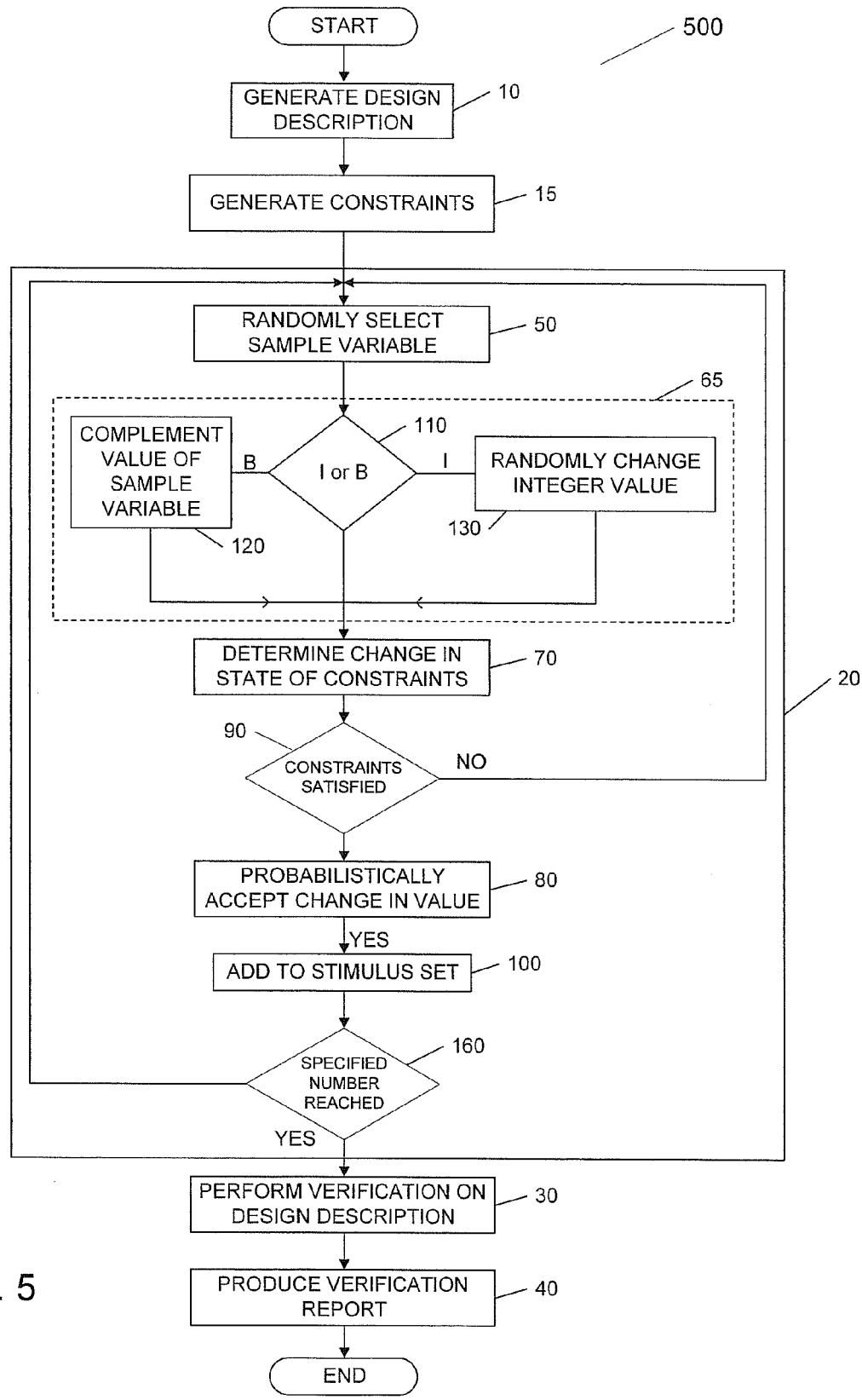
FIG. 5 is a flow chart illustration of a provided method.

Another provided method 500 is illustrated in FIG. 5. In this embodiment, the method 500 begins with stage 10 where a digital design description is generated for a design under test. As in above discussed method embodiments, at stage 15 a set Integer and a set of Boolean constraints are generated. In this embodiment, stage 20 comprises additional stages of through 130 and stage 65 includes stages 110 through 130. In stage 50 where a random selection of a sample variable is made from the design description. In this embodiment, stage 65 comprises decision stage 110 that determines if the selected sample variable is an Integer or a Boolean variable. If the sample variable is Boolean, flow continues to stage 120 where the value of the variable is complemented. If the sample variable is an integer variable, flow continues to stage 130 and a random change is made in the value of the integer. Flow then continues to stage 70 where a change in a state of constraints is determined. Flow then continues to stage decision 90. If the new assignment to the sample variable fails to satisfy the constraints, flow continues back to stage 50. If the new assignment satisfies the constraints, flow continues to stage 100 where the assignment is added to the set of stimuli. Flow then continues to stage 30 where a verification is performed on the digital design using the new stimuli set. Flow then continues to stage 40 where a verification report is generated from the verification.

Figure 6:
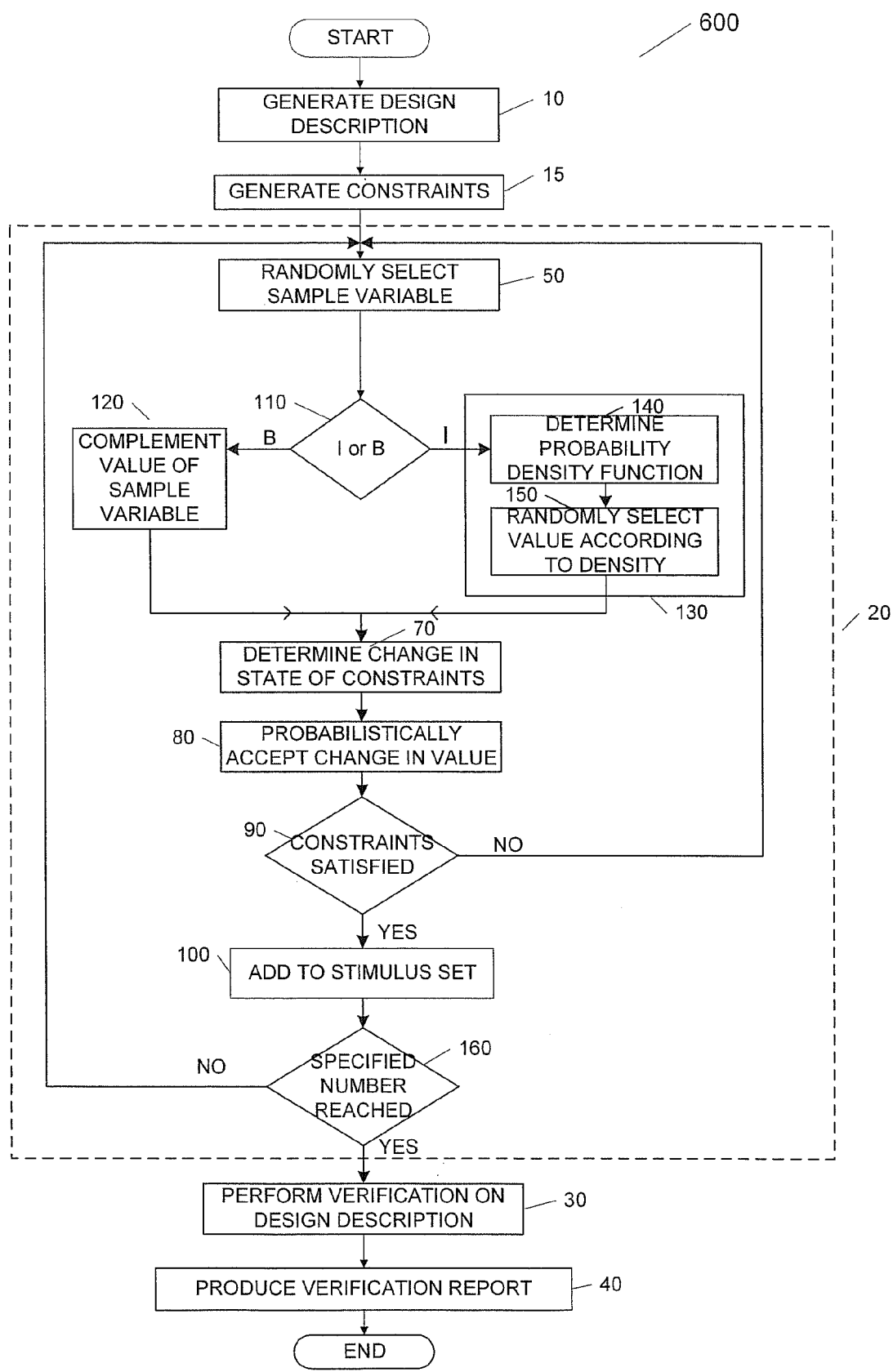
FIG. 6 is a flow chart illustration of a provided method.

A further embodiment of a method 600 is illustrated in FIG. 6. In this embodiment, like some of the embodiments, flow begins in stage 10 and proceeds through decision stage 110. In this embodiment, if the selected sample variable is an integer variable, flow continues to stage 130, like the above discussed embodiment. In this embodiment, stage 130 comprises stages 140 and 150. Flow continues to stage 140 where a probability density function is determined for the distribution of the selected integer variable. Flow then continues to stage 150 where a random value is selected for the variable from the density function. In like manner to some of the above embodiments, flow continues to stage 70 where a change in the state of constraints is determined. Flow then continues to decision stage 70 to determine if the new assignment satisfies the constraints. If it fails to satisfy the constraints, flow continues back to stage 50. If the new assignment satisfies the constraints, it is added to the stimuli set in stage 100 and flow continues to decision stage 160. If the pre-specified number of stimuli has not been reached in decision stage 160 flow continues back to stage 50 and the process iterated. Once the pre-specified number of constraints is reached in decision stage 160, flow continues to stage 30 where a verification is performed on the design description using the stimuli set. Flow then continues to stage 40 where a verification report is generated from the verification.

Figure 7:
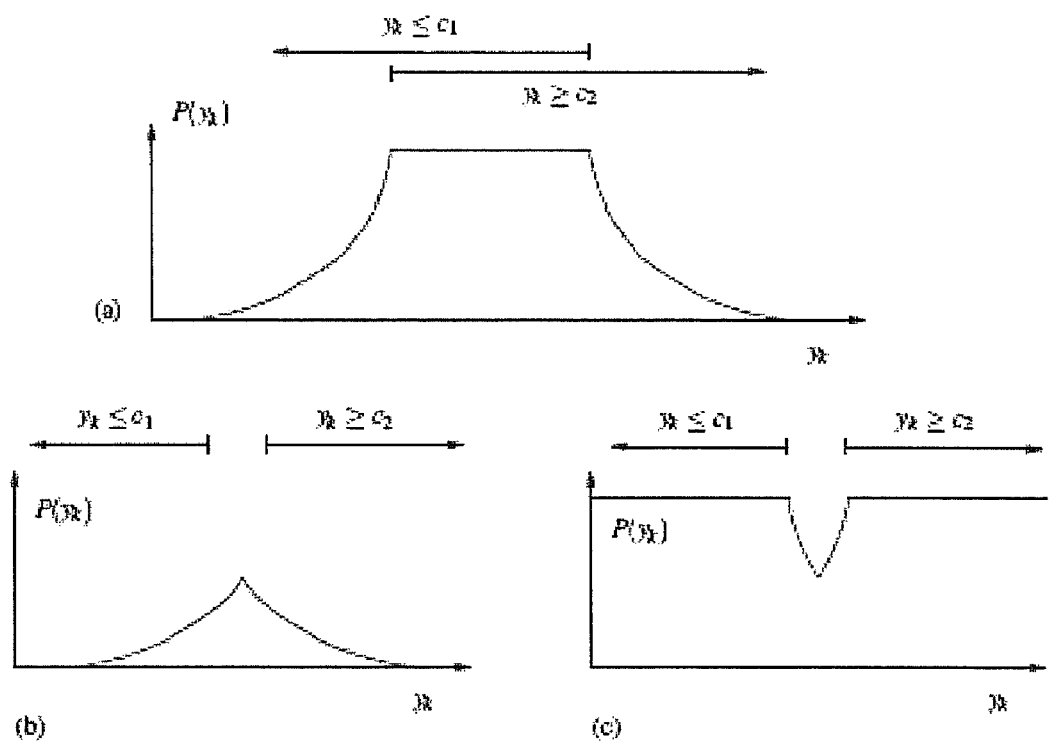
FIG. 7 illustrates an example probability density function consistent with provided embodiments.

As is known in the art, a Probability Density Function (PDF) is a statistical function that relates a range of values to the probability that they will be randomly selected. For the purpose of completeness, an example PDF for an inequality constraints consistent with the various provided embodiments is depicted in FIG. 7. In some embodiments various algorithms are used to randomly select a value from the PDF. Exemplary algorithms employed by various embodiments include a Metropolis Move, a WalkSat Move and a Davis Putnam Logemann Loveland (DPLL) Move. Employing these algorithms ensure that the randomly selected value stay within the PDF.

Figure 8:
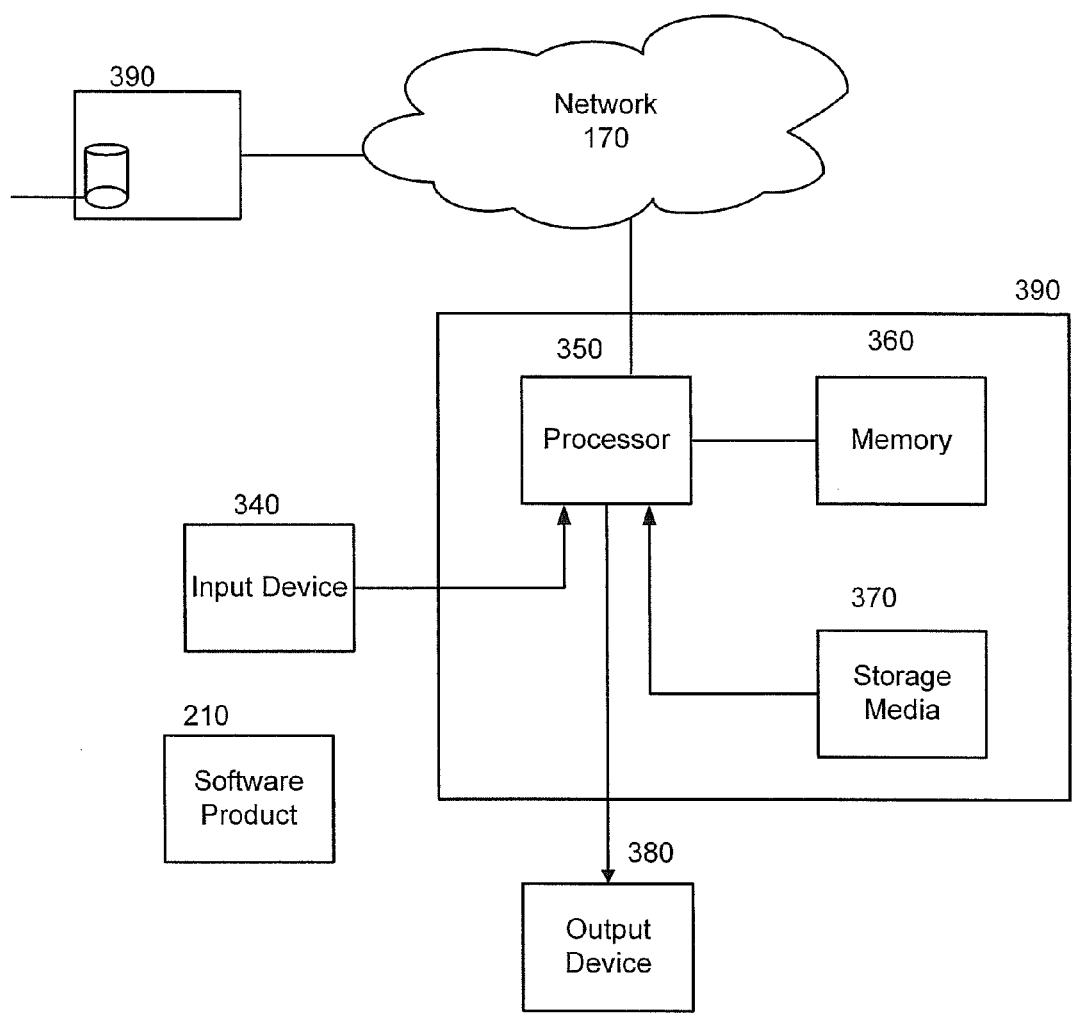
FIG. 8 illustrates a computing apparatus consistent with provided embodiments.

Digital design verification can be significant in terms of calculation complexity, time to complete, and the memory requirements of a computer running the verification. In one embodiment, illustrated in FIG. 8, a computing apparatus 390 is provided. In this embodiment, computing apparatus 390 may be configured using a software product 210 that implements the methods described above. Computing apparatus 390 may comprise an input device 340, a processor 350, a storage media 370, an output device 380 and memory 360. As is known in the art, various other components are necessary for computing apparatus 390 to be fully operational. These other components are not illustrated for purposes of convenience. Input device 340 may comprise a device for computer program product input, like a floppy drive, a CD-Rom drive, a DVD-drive, an optical drive to name a few. Many input devices 340 are known in the art and may be used to practice the present invention. In that regard, embodiments provided herein are not limited with respect to a particular input device 340. In like manner, various processors 350, storage media 370, output devices 380, and memory 360 are known in the art and may be used to practice the embodiments provided herein.

As stated above, computing apparatus 390 may be configured by a computer software product 210 that may take the form of a media containing program instructions that configure computing apparatus 390 to perform a digital design verification. In one embodiment, the media may be external to computing apparatus 390 and intended to interface with computing apparatus 390 through input device 340. In another embodiment, the media containing the instructions may be a hard drive on a network where computing apparatus 390 is connected through a network connection (not shown). As is known in the art, a network 170 may comprise a local area network within a company or may be a significantly larger network such as the Internet. In an additional embodiment, computer software product 210 may reside on another computing apparatus 390 across the network 170. As illustrated the computer software product, in this embodiment, resides on a database contained within the remote computing apparatus 390.

One aspect of a computing apparatus 390 configured with the computer software product provided herein is that it may efficiently verify digital designs of sizes where other software configurations may fail due to memory limitations.

As is known in the art, the above methods may be implemented in a number of programming languages, such as C or C++. Further particular computing apparatus that may be used to practice embodiments of the present invention include computers containing processors from Intel Corporation including but not limited to the Intel XEON™, and AMD Incorporated, including but not limited to the AMD Opteron™. Many such particular computing apparatus are manufactured and sold by companies such as Dell Computer, Sony Computer, Sun Microsystems, and Apple Computer to name a few. Embodiments of the present invention are not necessarily limited to a computing apparatus containing a specific type of processor or by the manufacturer of the computing apparatus. Further, embodiments of the present invention require the production of reports, such as a verification report and a stimulus report. One embodiment of a verification report contains the results of the verification of a digital design. One embodiment of a stimulus report contains a set of stimuli for verification of a digital design. As is known in the art, reports can include electronic files, in some instances suitable for display on a monitor and in some embodiments reports include printed reports.

Thus, it is seen that a system, method and apparatus for the rapid production of stimuli for verification of digital designs are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described embodiments does not mean that the product or process is outside the scope (literal scope and/or other legally-recognized scope) of the following claims.

What is claimed is:

1. A computer-implemented method of producing a verification report of a digital design comprising:
    generating a description of a digital design;
    generating a set of Boolean constraints and a set of integer constraints describing a valid set of input stimuli for the design description, including:
        randomly selecting a Boolean or an Integer sample variable;
        randomly changing the state of the selected sample variable; and
        determining a change in the number of satisfied clauses in combined set of Boolean and Integer constraints;
    generating a mixed Boolean-Integer input stimuli set for the digital design description, the input stimuli satisfying the set of Boolean constraints and the set of integer constraints;
    performing, on a computing apparatus, a verification on the design description utilizing the input stimuli; and
    producing a verification report from the verification.

2. The method of claim 1, wherein the input stimuli set comprises samples from non-connected solution spaces.

3. The method of claim 1, wherein the changed sample is accepted as part of the input stimuli set if the change in number of satisfied clauses exceeds a threshold and probabilistically rejected if the change does not exceed the threshold.

4. The method of claim 3, wherein the random selection of a sample variable, the random change of state, the determining the number of satisfied clauses and the addition of the change to the stimuli set is iterated until a predetermined number of stimuli are generated.

5. The method of claim 1, wherein if the random sample variable is a Boolean variable the random change is complementing the value of a Boolean sample variable, the method further comprising determining the validity of the random sample as an input stimulus.

6. The method of claim 1, wherein if the random sample variable is an Integer variable the random change comprises determining a probability density function for the variable and randomly selecting a value from the density function, the method further comprising determining the validity of the random sample as an input stimulus.

7. The method of claim 6, wherein the selecting a value follows an algorithm selected from a group consisting of a Metropolis Move, a WalkSat Move and a Davis Putnam Logemann Loveland (DPLL) Move.

8. The method of claim 1, wherein the generation of a mixed Boolean-Integer stimuli set is iteratively performed until a predetermined number of stimuli are generated in the set.

9. A computing apparatus comprising:
    a processor;
    a memory;
    a storage wherein the storage contains a set of processor executable instructions that, when executed by the processor will configure the computing apparatus to:
    generate a description of a digital design;
    generate a set of Boolean constraints and a set of integer constraints describing a valid set of input stimuli for the design description, including:
        randomly select a Boolean or an Integer sample variable;
        randomly change the state of the selected sample variable; and
        determine a change in the number of satisfied clauses in combined set of Boolean and Integer constraints;
    generate a mixed Boolean-Integer input stimuli set for the digital design description, the input stimuli satisfying the set of Boolean constraints and the set of integer constraints;
    perform a verification on the design description utilizing the input stimuli; and
    produce a verification report from the verification.

10. The computing apparatus of claim 9, wherein the input stimuli set comprises samples from non-connected solution spaces.

11. The computing apparatus of claim 9, wherein the changed sample is accepted as part of the input stimuli set if the change in number of satisfied clauses exceeds a threshold and probabilistically rejected if the change does not exceed the threshold.

12. The computing apparatus of claim 11, wherein the configuration for random selection of a sample variable, the random change of state, the determination of the number of satisfied clauses and the addition of the change to the stimuli set is iterated until a predetermined number of stimuli are generated.

13. The computing apparatus of claim 9, wherein if the random sample variable is a Boolean variable the random change is complementing the value of a Boolean sample variable, the configuration further comprising a configuration to determine the validity of the random sample as an input stimulus.

14. The computing apparatus of claim 9, wherein if the random sample variable is an Integer variable the random change comprises determining a probability density function for the variable and randomly selecting a value from the density function, the configuration further comprising a configuration to determine the validity of the random sample as an input stimulus.

15. The computing apparatus of claim 14, wherein the configuration for selecting a value follows an algorithm selected from a group consisting of a Metropolis Move, a WalkSat Move and a Davis Putnam Logemann Loveland (DPLL) Move.

16. The computing apparatus of claim 9, wherein the generation of a mixed Boolean-Integer stimuli set is iteratively performed until a predetermined number of stimuli are generated in the set.

17. A computer software product comprising:
    a non-transitory machine-readable medium, the non-transitory machine-readable medium containing set of processor executable instructions sufficient to configure a computing apparatus to:
    generate a description of a digital design;
    generate a set of Boolean constraints and a set of integer constraints describing a valid set of input stimuli for the design description, including:
        randomly select a Boolean or an Integer sample variable;
        randomly change the state of the selected sample variable; and
        determine a change in the number of satisfied clauses in combined set of Boolean and Integer constraints;
    generate a mixed Boolean-Integer input stimuli set for the digital design description, the input stimuli satisfying the set of Boolean constraints and the set of integer constraints;
    perform a verification on the design description utilizing the input stimuli; and
    produce a verification report from the verification.

18. The software product of claim 17, wherein the input stimuli set comprises samples from non-connected solution spaces.

19. The software product of claim 17, wherein the changed sample is accepted as part of the input stimuli set if the change in number of satisfied clauses exceeds a threshold and probabilistically rejected if the change does not exceed the threshold.

20. The software product of claim 19, wherein if the random sample variable is a Boolean variable the random change is complementing the value of a Boolean sample variable, the configuration further comprising a configuration to determine the validity of the random sample as an input stimulus.

21. The software product of claim 19, wherein if the random sample variable is an Integer variable the random change comprises determining a probability density function for the variable and randomly selecting a value from the density function, the configuration further comprising a configuration to determine the validity of the random sample as an input stimulus.

22. The software product of claim 21, wherein the selecting a value follows an algorithm selected from a group consisting of a Metropolis Move, a WalkSat Move and a Davis Putnam Logemann Loveland (DPLL) Move.

23. The software product of claim 19, wherein the configuration for the random selection of a sample variable, the random change of state, the determining the number of satisfied clauses and the addition of the change to the stimuli set is iterated until a predetermined number of stimuli are generated.

24. The software product of claim 17, wherein the configuration for generation of a mixed Boolean-Integer stimuli set is iteratively performed until a predetermined number of stimuli are generated in the set.

* * * * *